(12) United States Patent
Konno et al.

(10) Patent No.: US 10,425,116 B2
(45) Date of Patent: Sep. 24, 2019

(54) ELASTIC WAVE DEVICE, HIGH FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventors: Akira Konno, Nagaokakyo (JP); Masakazu Mimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/922,955

(22) Filed: Mar. 16, 2018

(65) Prior Publication Data

US 2018/0205403 A1    Jul. 19, 2018

Related U.S. Application Data

(63) Continuation of application No. PCT/JP2016/075995, filed on Sep. 5, 2016.

(30) Foreign Application Priority Data

Oct. 23, 2015   (JP) .................................. 2015-208923

(51) Int. Cl.
*H03H 3/10* (2006.01)
*H03H 9/02* (2006.01)
(Continued)

(52) U.S. Cl.
CPC ............. *H04B 1/1036* (2013.01); *H03H 3/10* (2013.01); *H03H 9/02559* (2013.01);
(Continued)

(58) Field of Classification Search
CPC ................... H03H 3/08; H03H 3/10; H03H 9/02007–9/02992
(Continued)

(56) References Cited

U.S. PATENT DOCUMENTS

| 7,589,606 B2 * | 9/2009 | Takayama ................ H03H 3/10 333/193 |
| 2007/0214622 A1 * | 9/2007 | Nishiyama ............... H03H 3/10 29/25.35 |

(Continued)

FOREIGN PATENT DOCUMENTS

| JP | 2007-317997 A | 12/2007 |
| JP | 2009-194895 A | 8/2009 |

(Continued)

OTHER PUBLICATIONS

Official Communication issued in International Patent Application No. PCT/JP2016/075995, dated Nov. 22, 2016.
(Continued)

*Primary Examiner* — Sonny Trinh
(74) *Attorney, Agent, or Firm* — Keating & Bennett, LLP

(57) ABSTRACT

An elastic wave device includes a $LiNbO_3$ substrate, an IDT electrode provided on the $LiNbO_3$ substrate, and a dielectric film that is provided on the $LiNbO_3$ substrate so as to cover the IDT electrode and includes a projection on an upper surface of the stated dielectric film. A main mode of an elastic wave excited by the IDT electrode uses a Rayleigh wave, and a thickness of the IDT electrode is set such that a frequency at which a response by an SH wave appears is lower than a resonant frequency of the Rayleigh wave.

20 Claims, 10 Drawing Sheets

(51) Int. Cl.
*H03H 9/10* (2006.01)
*H03H 9/25* (2006.01)
*H03H 9/64* (2006.01)
*H04B 1/10* (2006.01)
*H03H 9/145* (2006.01)
*H01L 41/047* (2006.01)

(52) U.S. Cl.
CPC ...... *H03H 9/02637* (2013.01); *H03H 9/1092* (2013.01); *H03H 9/145* (2013.01); *H03H 9/14541* (2013.01); *H03H 9/25* (2013.01); *H03H 9/6406* (2013.01); *H03H 9/6489* (2013.01); *H01L 41/0477* (2013.01)

(58) Field of Classification Search
USPC ......................................................... 455/286
See application file for complete search history.

(56) References Cited

U.S. PATENT DOCUMENTS

| | | | | |
|---|---|---|---|---|
| 2007/0241840 A1* | 10/2007 | Takayama | ................ | H03H 3/10 333/193 |
| 2007/0284680 A1* | 12/2007 | Hashimura | .......... | H03H 3/0072 257/415 |
| 2009/0009028 A1* | 1/2009 | Nishiyama | ........ | H03H 9/02559 310/313 B |
| 2009/0021107 A1 | 1/2009 | Nishiyama et al. | | |
| 2009/0237181 A1* | 9/2009 | Kadota | .............. | H03H 9/02551 333/193 |
| 2010/0148626 A1* | 6/2010 | Warashina | ......... | H03H 9/02574 310/313 C |
| 2010/0187947 A1* | 7/2010 | Mimura | ............... | H03H 9/0222 310/313 A |
| 2011/0199168 A1* | 8/2011 | Kadota | .............. | H03H 9/02559 333/195 |
| 2011/0309719 A1* | 12/2011 | Yamazaki | .......... | H03H 9/02818 310/313 C |
| 2012/0091547 A1* | 4/2012 | Kamiyama | ......... | B81C 1/00142 257/418 |
| 2012/0286900 A1* | 11/2012 | Kadota | .............. | H03H 9/02559 333/188 |
| 2013/0088121 A1* | 4/2013 | Yaoi | ..................... | H03H 9/0222 310/313 A |
| 2013/0300519 A1* | 11/2013 | Tamasaki | ........... | H03H 9/02559 333/133 |
| 2014/0152145 A1* | 6/2014 | Kando | ..................... | H03H 3/02 310/313 A |
| 2014/0152146 A1* | 6/2014 | Kimura | ............. | H03H 9/02228 310/313 B |
| 2014/0285287 A1 | 9/2014 | Komatsu et al. | | |
| 2015/0061466 A1* | 3/2015 | Kimura | .................. | H01L 41/18 310/365 |
| 2016/0156331 A1 | 6/2016 | Miwa et al. | | |

FOREIGN PATENT DOCUMENTS

| | | |
|---|---|---|
| JP | 2012-186642 A | 9/2012 |
| JP | 2013-138333 A | 7/2013 |
| JP | 2013-145930 A | 7/2013 |
| JP | 2013-150349 A | 8/2013 |
| JP | 2014-158138 A | 8/2014 |
| JP | 2014187568 A | 10/2014 |
| JP | 2015-111845 A | 6/2015 |
| WO | 2007/125733 A1 | 11/2007 |
| WO | 2007/125734 A1 | 11/2007 |
| WO | 2008/081695 A1 | 7/2008 |
| WO | 2010/101166 A1 | 9/2010 |
| WO | 2014/054580 A1 | 4/2014 |
| WO | 2015/022931 A1 | 2/2015 |

OTHER PUBLICATIONS

Official Communication issued in Japanese Patent Application No. 2017-546448, dated Feb. 5, 2019.

* cited by examiner

ELASTIC WAVE DEVICE, HIGH FREQUENCY FRONT-END CIRCUIT, AND COMMUNICATION APPARATUS

CROSS REFERENCE TO RELATED APPLICATIONS

This application claims the benefit of priority to Japanese Patent Application No. 2015-208923 filed on Oct. 23, 2015 and is a Continuation Application of PCT Application No. PCT/JP2016/075995 filed on Sep. 5, 2016. The entire contents of each application are hereby incorporated herein by reference.

BACKGROUND OF THE INVENTION

1. Field of the Invention

The present invention relates to an elastic wave device in which an interdigital transducer (IDT) electrode and a dielectric film are laminated on a LiNbO$_3$ substrate, and a high frequency front-end circuit and a communication apparatus including the elastic wave device.

2. Description of the Related Art

Elastic wave devices using a LiNbO$_3$ substrate are widely used. For example, an elastic wave device using a LiNbO$_3$ substrate is disclosed in WO 02010/101166 A1. An IDT electrode is provided on the LiNbO$_3$ substrate in WO 02010/101166 A1. Further, an insulation film, such as a SiO$_2$ film, is provided on the LiNbO$_3$ substrate so as to cover the IDT electrode. Rayleigh waves are used as elastic waves in the elastic wave device described in WO 02010/101166 A1.

The elastic wave device described in WO 02010/101166 A1 uses Rayleigh waves. However, in a case of an elastic wave resonator, for example, spurious emission caused by SH (Shear Horizontal) waves undesirably appears in some cases in a frequency region between a resonant frequency and an anti-resonant frequency or within a pass band of a band pass filter.

SUMMARY OF THE INVENTION

Preferred embodiments of the present invention provide elastic wave devices, high frequency front-end circuits, and communication apparatuses in which spurious emission caused by SH waves is unlikely to be generated in a frequency region between a resonant frequency and an anti-resonant frequency or within a pass band of a band pass filter.

An elastic wave device according to a preferred embodiment of the present invention includes a LiNbO$_3$ substrate, an IDT electrode provided on the LiNbO$_3$ substrate, and a dielectric film that is provided on the LiNbO$_3$ substrate so as to cover the IDT electrode and includes a projection on an upper surface of the dielectric film. In the elastic wave device, the main mode of an elastic wave excited by the IDT electrode uses a Rayleigh wave, and the IDT electrode has a thickness such that a frequency at which a response by an SH wave appears is lower than a resonant frequency of the Rayleigh wave.

An elastic wave device according to a preferred embodiment of the present invention includes a LiNbO$_3$ substrate, an IDT electrode provided on the LiNbO$_3$ substrate, and a dielectric film that is provided on the LiNbO$_3$ substrate so as to cover the IDT electrode and includes a projection on an upper surface of the dielectric film. In the elastic wave device, the IDT electrode includes a main electrode layer including at least one metal selected from a group consisting of Pt, W, Mo, Ta, Au and Cu, and a film thickness of the main electrode layer is set so as to fall within a film thickness range, as shown in Table 1 given below, with respect to a wavelength λ determined by an electrode finger pitch of the IDT electrode.

TABLE 1

| | Film thickness (ratio with respect to λ) |
|---|---|
| Pt | 4.9% or more |
| W | 6.6% or more |
| Mo | 16.3% or more |
| Ta | 7.9% or more |
| Au | 4.7% or more |
| Cu | 15.8% or more |

In an elastic wave device according to a preferred embodiment of the present invention, a height of the projection is, when a wavelength determined by the electrode finger pitch of the IDT electrode is λ, no less than about 0.5% and no more than about 3.0% of λ.

In an elastic wave device according to a preferred embodiment of the present invention, the height of the projection is, when a wavelength determined by the electrode finger pitch of the IDT electrode is λ, no less than about 0.5% and less than about 1.0% of λ.

In an elastic wave device according to a preferred embodiment of the present invention, where Euler angles of the LiNbO$_3$ substrate are (0°±5°, θ, 0°±5°), θ falls within a range of no less than about 27.5° and no more than about 31.5°. In this case, SH wave spurious emission is able to be reduced.

In an elastic wave device according to a preferred embodiment of the present invention, the dielectric film is made of silicon oxide. In this case, an absolute value of a temperature coefficient of resonant frequency TCF of the elastic wave device is small.

In an elastic wave device according to a preferred embodiment of the present invention, the IDT electrode is made of a laminated metal film including the main electrode layer and another electrode layer.

In an elastic wave device according to a preferred embodiment of the present invention, the elastic wave device defines a band pass filter. In this case, spurious emission caused by SH waves is unlikely to be generated within a pass band of the band pass filter.

A high frequency front-end circuit according to a preferred embodiment of the present invention includes an elastic wave device according to a preferred embodiment of the present invention and a power amplifier.

A communication apparatus according to a preferred embodiment of the present invention includes a high frequency front-end circuit according to a preferred embodiment of the present invention, an RF signal processing circuit, and a baseband signal processing circuit.

With elastic wave devices according to preferred embodiments of the present invention, degradation in characteristics by the SH wave spurious emission is unlikely to occur, because a frequency position of the SH wave spurious emission is outside a frequency region between the resonant frequency and the anti-resonant frequency or outside a pass band of the band pass filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

It is to be noted that the preferred embodiments described in the present specification are merely examples, and that configurations may be partially replaced or combined with each other between different preferred embodiments.

Figure 1A:
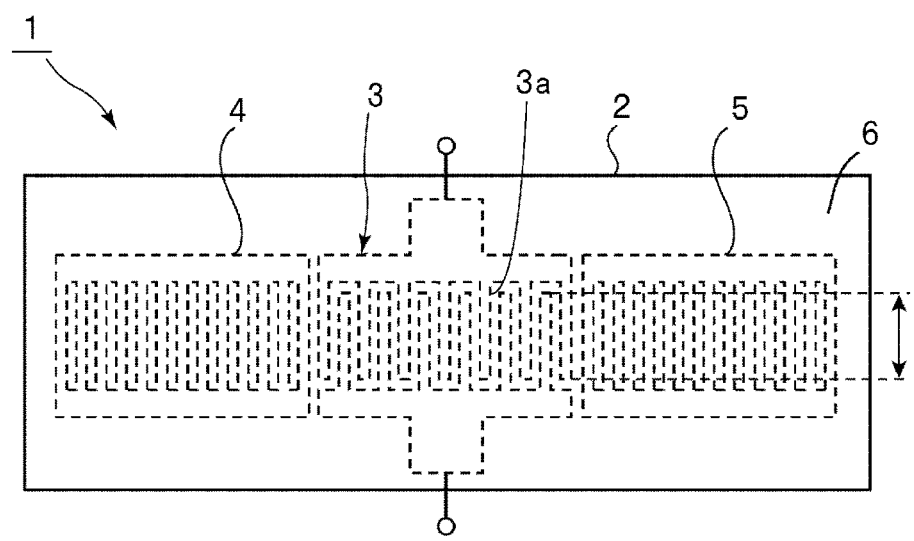
FIG. 1A is a plan view of an elastic wave device according to a preferred embodiment of the present invention.
Figure 1B:
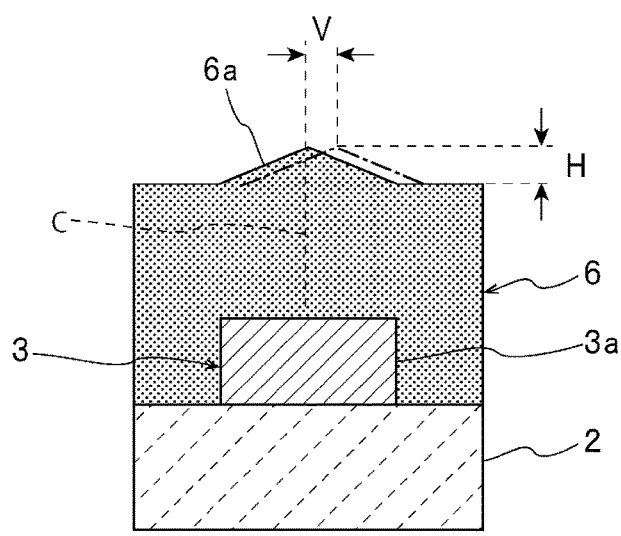
FIG. 1B is a partially enlarged front cross-sectional view illustrating a major portion of the elastic wave device.

FIG. 1A is a plan view of an elastic wave device according to a preferred embodiment of the present invention, and FIG. 1B is a partially enlarged front cross-sectional view illustrating a major portion of the elastic wave device.

An elastic wave device 1 includes a $LiNbO_3$ substrate 2. An IDT electrode 3 is provided on the $LiNbO_3$ substrate 2. The IDT electrode 3 includes a plurality of electrode fingers 3a. Reflectors 4 and 5 are provided on both sides in an elastic wave propagation direction of the IDT electrode 3. With this, a one-port type elastic wave resonator is provided.

A dielectric film 6 is provided so as to cover the IDT electrode 3 in the elastic wave device 1. The dielectric film 6 is preferably made of $SiO_2$, for example, in the present preferred embodiment. Because of the dielectric film 6 being made of $SiO_2$, an absolute value of a temperature coefficient of resonant frequency TCF is small in the elastic wave device 1. Note that, however, the dielectric film 6 may be made of another dielectric material, other than silicon oxide, such as silicon oxynitride, for example.

The dielectric film 6 is preferably formed on the $LiNbO_3$ substrate 2 by a deposition method, such as vapor deposition, for example. As such, a projection 6a proportional to a thickness of the IDT electrode 3 appears on an upper surface of the dielectric film 6 on the upper side of the electrode finger 3a. The height of the projection 6a is taken as H. As illustrated in FIG. 1B, the height H is a difference in height between an apex of the projection 6a and the upper surface of the dielectric film 6 in a region other than the projection 6a.

The elastic wave device 1 uses a Rayleigh wave. In this case, a response by an SH wave becomes spurious emission. The response by the SH wave refers to resonance caused by the SH wave and refers to resonance characteristics in a frequency region including the resonant frequency and the anti-resonant frequency. In a case in which SH wave spurious emission appears in a frequency region between the resonant frequency and the anti-resonant frequency in an elastic wave resonator, the characteristics degrade significantly. In the elastic wave device 1 of the present preferred embodiment, preferably, the IDT electrode includes a main electrode layer made of one metal selected from a group consisting of Pt, W, Mo, Ta, Au and Cu, for example, and a film thickness of the main electrode layer is so set as to fall within a film thickness range, as shown in Table 1 given below, with respect to a wavelength λ determined by the electrode finger pitch of the IDT electrode.

TABLE 1

| | Film thickness (ratio with respect to λ) |
|---|---|
| Pt | 4.9% or more |
| W | 6.6% or more |
| Mo | 16.3% or more |
| Ta | 7.9% or more |
| Au | 4.7% or more |
| Cu | 15.8% or more |

In the elastic wave device 1, the SH wave spurious emission is able to be positioned in an outer side portion of the frequency region between the resonant frequency and the anti-resonant frequency because the film thickness of the main electrode layer of the IDT electrode is set to fall within a range shown in Table 1 described above in accordance with the electrode material. This will be explained below with reference to FIGS. 2 to 7.

Figure 2:
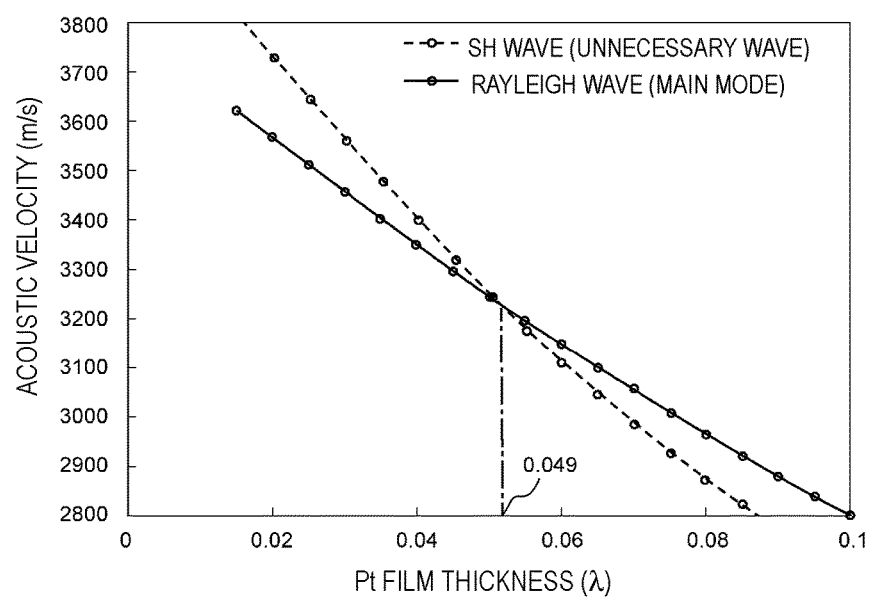
FIG. 2 is a graph, in a case in which an IDT electrode is made of a Pt film, showing a relationship between a film thickness of the Pt film and a Rayleigh wave acoustic velocity as well as an SH wave acoustic velocity.
Figure 3:
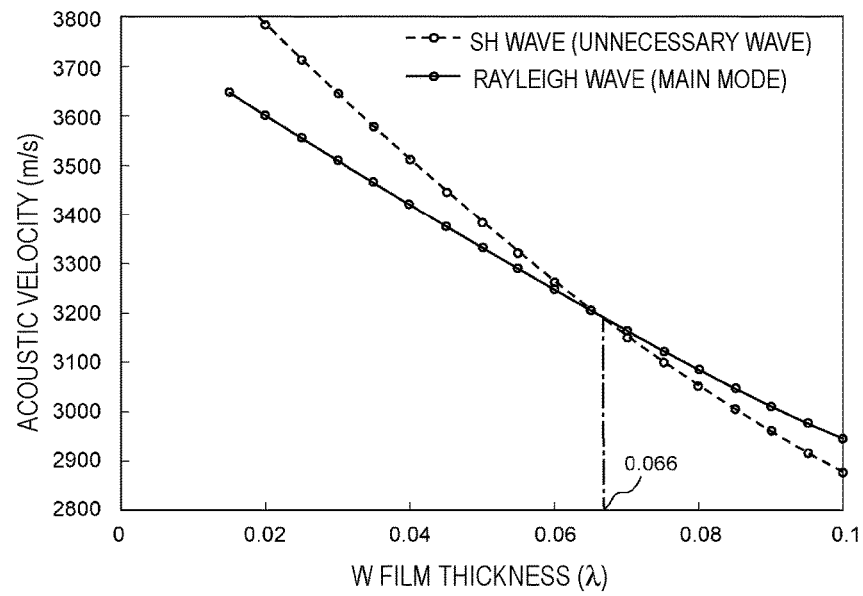
FIG. 3 is a graph, in a case in which an IDT electrode is made of a W film, showing a relationship between a film thickness of the W film and a Rayleigh wave acoustic velocity as well as an SH wave acoustic velocity.
Figure 4:
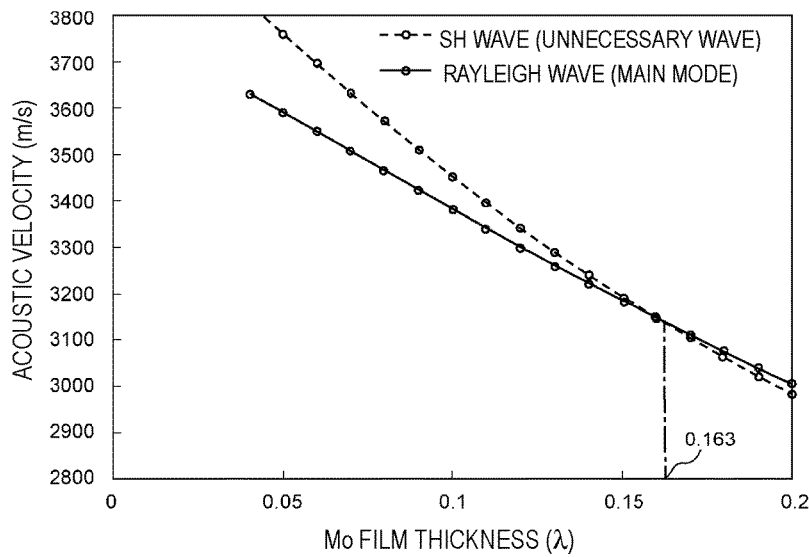
FIG. 4 is a graph, in a case in which an IDT electrode is made of a Mo film, showing a relationship between a film thickness of the Mo film and a Rayleigh wave acoustic velocity as well as an SH wave acoustic velocity.
Figure 5:
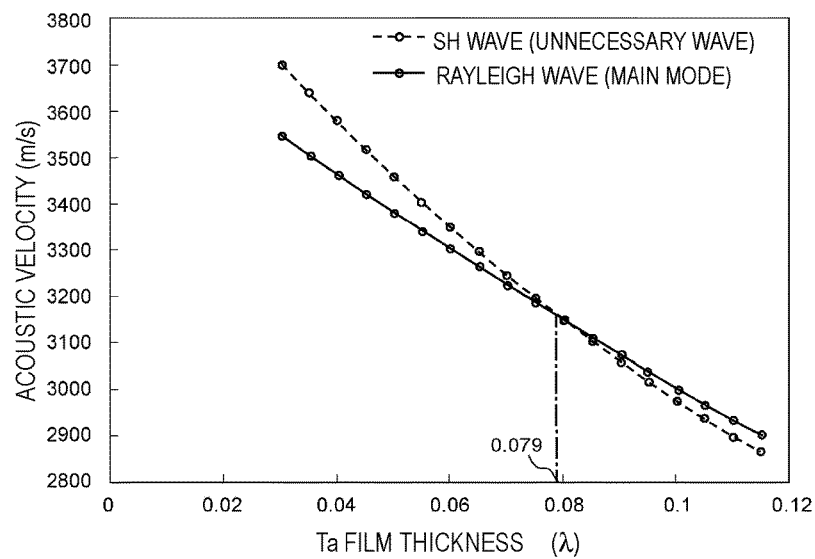
FIG. 5 is a graph, in a case in which an IDT electrode is made of a Ta film, showing a relationship between a film thickness of the Ta film and a Rayleigh wave acoustic velocity as well as an SH wave acoustic velocity.
Figure 6:
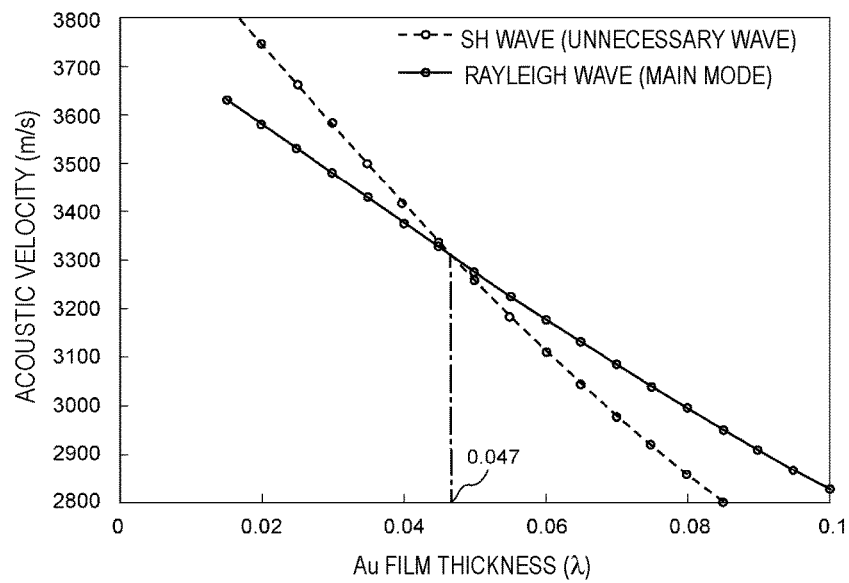
FIG. 6 is a graph, in a case in which an IDT electrode is made of an Au film, showing a relationship between a film thickness of the Au film and a Rayleigh wave acoustic velocity as well as an SH wave acoustic velocity.
Figure 7:
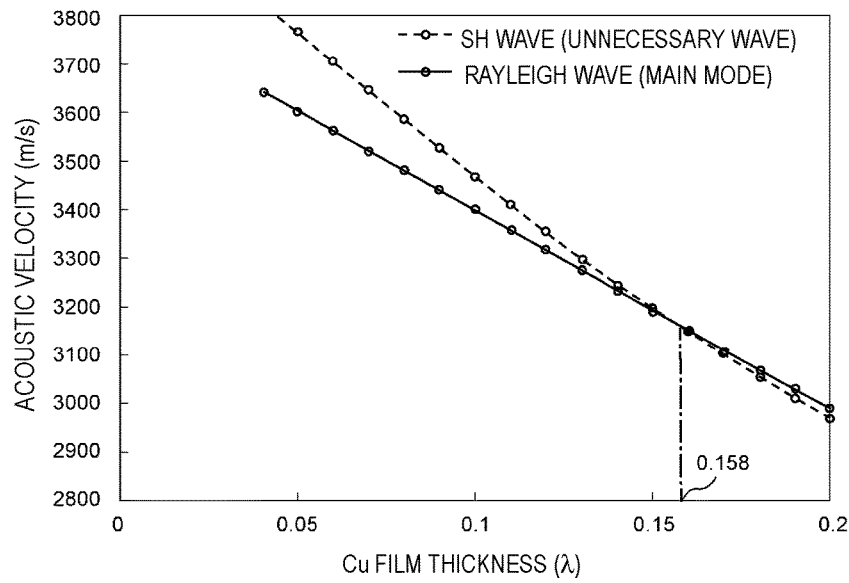
FIG. 7 is a graph, in a case in which an IDT electrode is made of a Cu film, showing a relationship between a film thickness of the Cu film and a Rayleigh wave acoustic velocity as well as an SH wave acoustic velocity.

FIGS. 2 to 7 are graphs each showing a relationship between an electrode film thickness of the IDT electrode and a Rayleigh wave acoustic velocity as well as an SH wave acoustic velocity. FIG. 2 shows a result of a case in which the IDT electrode is made of a Pt film, FIG. 3 shows a result of a case in which the IDT electrode is made of a W film, FIG. 4 shows a result of a case in which the IDT electrode is made of a Mo film, FIG. 5 shows a result of a case in which the IDT electrode is made of a Ta film, FIG. 6 shows a result of a case in which the IDT electrode is made of an Au film, and FIG. 7 shows a result of a case in which the IDT electrode is made of a Cu film. In each of the cases, a LiNbO$_3$ substrate with Euler angles (0°, 30°, 0°) was used as the LiNbO$_3$ substrate. The duty of the IDT electrode was set to be about 0.60. A SiO$_2$ film with a thickness of about 0.35λ was provided as the dielectric film 6.

As is clear from FIGS. 2 to 7, when the thickness of the IDT electrode exceeds a certain value, the SH wave acoustic velocity becomes lower than the Rayleigh wave acoustic velocity. For example, in the case of the Pt film in FIG. 2, the SH wave acoustic velocity becomes lower than the Rayleigh wave acoustic velocity when the film thickness of the Pt film exceeds about 0.049λ. Note that λ is a wavelength determined by the electrode finger pitch of the IDT electrode 3. Accordingly, by making the film thickness of the Pt film be about 0.049λ or more, the response by the SH wave is able to be positioned in a frequency region lower than the resonant frequency of the response of the Rayleigh wave.

As shown in FIG. 3, in the case of the W film, by making the film thickness of the IDT electrode 3 be about 0.066λ or more, the response by the SH wave is able to be similarly positioned in a frequency region lower than the resonant frequency of the response of the Rayleigh wave.

As shown in FIG. 4, in the case of the Mo film, when the film thickness is about 0.163λ or more, the response by the SH wave is able to be positioned in a frequency region lower than the resonant frequency of the response of the Rayleigh wave.

As shown in FIG. 5, in the case of the Ta film, when the film thickness is about 0.079λ or more, the response by the SH wave is able to be positioned in a frequency region lower than the resonant frequency of the response of the Rayleigh wave.

As shown in FIG. 6, in the case of the Au film, when the film thickness is about 0.047λ or more, the response by the SH wave is able to be positioned in a frequency region lower than the resonant frequency of the response of the Rayleigh wave.

As shown in FIG. 7, in the case of the Cu film, when the film thickness is about 0.158λ or more, the response by the SH wave is able to be positioned in a frequency region lower than the resonant frequency of the response of the Rayleigh wave.

That is, as shown in Table 1 described above, in the case of Pt, W, Mo, Ta, Au, or Cu, when the film thickness thereof is no less than about 4.9% of λ, no less than about 6.6% of λ, no less than about 16.3% of λ, no less than about 7.9% of λ, no less than about 4.7% of λ, or no less than about 15.8% of λ, respectively, the response by the SH wave is able to be positioned in a frequency region lower than the resonant frequency of the response of the Rayleigh wave. Accordingly, as indicated by a solid line in FIG. 18, a response S1 by the SH wave is able to be positioned in a frequency region lower than the resonant frequency of the Rayleigh wave which is a main response. In this case, the degradation in characteristics is able to be effectively reduced or prevented because the response S1 by the SH wave is not positioned between the resonant frequency and the anti-resonant frequency.

Figure 18:
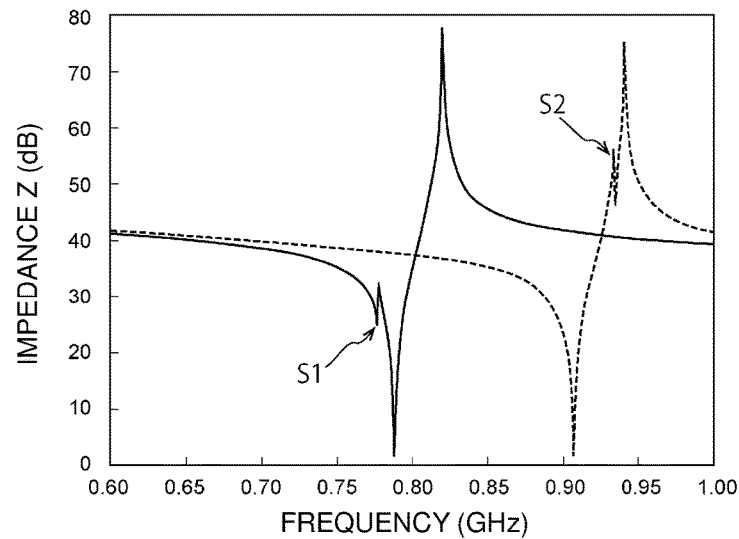
FIG. 18 is a graph showing impedance characteristics of the first working example of a preferred embodiment of the present invention and impedance characteristics of a comparative example.

A broken line in FIG. 18 indicates impedance characteristics of a comparative example. In the comparative example, the electrode film thickness is less than the ranges shown in Table 1 described above. In this case, a response S2 by the SH wave appears in a frequency region between the resonant frequency and the anti-resonant frequency of the Rayleigh wave. Accordingly, satisfactory resonance characteristics are not able to be obtained.

The upper limit of the film thickness of the IDT electrode is not limited to any specific value in order for the SH wave response to be positioned in a frequency region lower than the resonant frequency of the Rayleigh wave response. However, if the film thickness of the main electrode layer of the IDT electrode is excessively thick, the cost increases, a variation in characteristics becomes large when the electrode finger width varies, or other problems arise. As such, although the upper limit is not limited to any specific value in terms of obtaining the advantageous effects of the present invention, it is preferable for the film thickness to be no more than about 10% of the wavelength λ for the above-described reason in the case of using a Pt electrode. Because the magnitude of influence of the variation in the electrode finger width is substantially proportional to the density of the electrode material, it is preferable to make the film thickness no more than about $10 \times \rho_{Pt}/\rho$ %, for example, when using an electrode material other than Pt.

As illustrated in FIG. 1B, the projection 6a is provided on the upper surface of the dielectric film 6. It is preferable for the height H of the projection 6a to be no less than about 0.5% and no more than about 3.0% of the wavelength λ, for example. This makes it possible to provide an elastic wave device in which not only the influence of SH wave spurious emission is small but also a variation in frequency is small. This point will be explained below with reference to FIGS. 8 to 12.

The reason that it is preferable for the height H of the projection 6a on a surface of the dielectric film 6 to be no less than about 0.5% of the wavelength λ will be described below.

Figure 8:
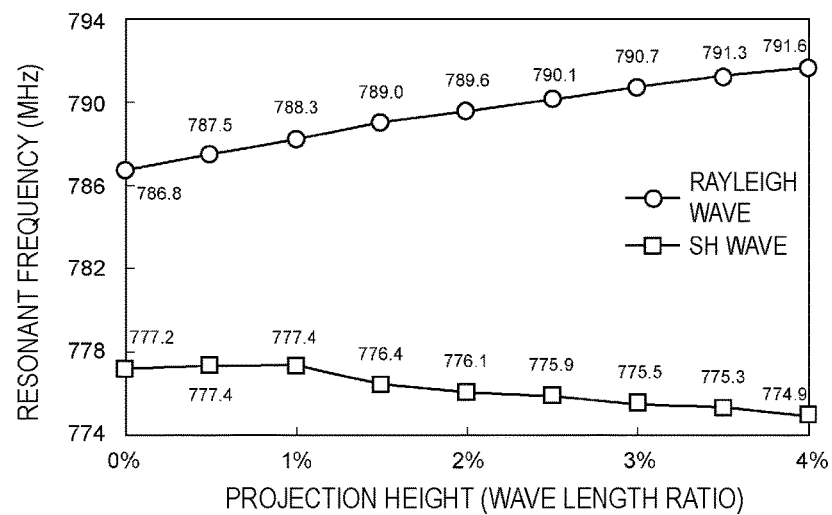
FIG. 8 is a graph showing a relationship between a height of a projection and a resonant frequency of a Rayleigh wave response as well as a resonant frequency of an SH wave response.
Figure 9:
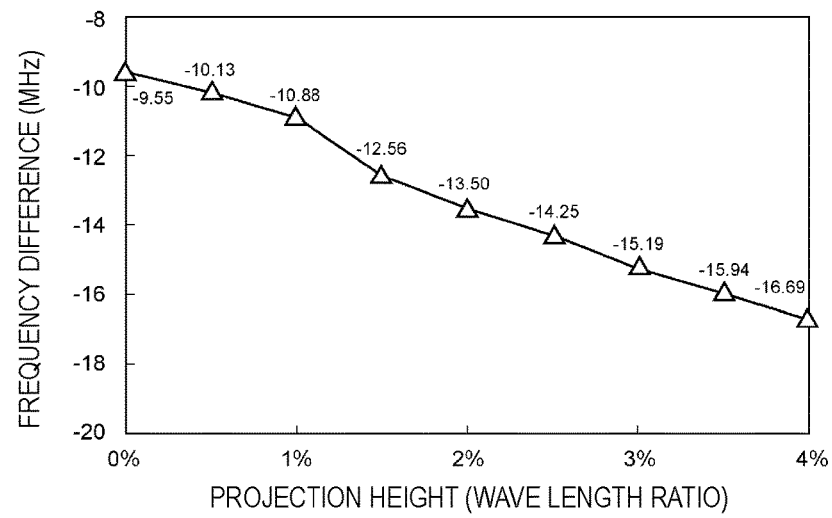
FIG. 9 is a graph showing a relationship between a height of a projection and a frequency difference which is a difference between a resonant frequency of a Rayleigh wave and a resonant frequency of an SH wave.

As discussed before, in a range in which the SH wave acoustic velocity is lower than the Rayleigh wave acoustic velocity, as the height of the projection increases, a difference between the resonant frequency of the Rayleigh wave and the resonant frequency of the SH wave becomes larger, as shown in FIG. 8. In addition, the resonant frequency of the SH wave becomes lower relative to the resonant frequency of the Rayleigh wave. FIG. 9 is a graph showing a relationship between the height of the projection and a frequency difference between the resonant frequency of the Rayleigh wave and the resonant frequency of the SH wave.

As is clear from FIGS. 8 and 9, it is preferable for the height H of the projection 6a on the surface of the dielectric film 6 to be larger than about 0.5% of the wavelength λ determined by the electrode finger pitch. This makes it possible to further distance the resonant frequency of the SH wave, which is an unnecessary wave, from the resonant frequency of the Rayleigh wave by no less than about 0.6 MHz.

In other words, by making the height H of the projection 6a on the surface of the dielectric film 6 larger than about 0.5% of the wavelength λ determined by the electrode finger pitch, it possible to further distance the resonant frequency of the SH wave, which is an unnecessary wave, from the resonant frequency of the Rayleigh wave by no less than about 0.6 MHz without changing the film thickness of the IDT electrode.

Accordingly, adjusting the film thickness of the IDT electrode and the height of the projection makes it possible to distance the response of the SH wave by about 1.3% or more of the resonant frequency of the Rayleigh wave, and obtain more preferable resonance characteristics. As such, in a case in which a ladder filter or other suitable filter is defined by the elastic wave device 1, it is also possible to support Band 12 with a frequency band width being about 2.35%, for example.

Next, the reason why it is preferable for the height H of the projection 6a on the surface of the dielectric film 6 to be no more than about 3.0% of the wavelength λ will be described below.

Figure 10:
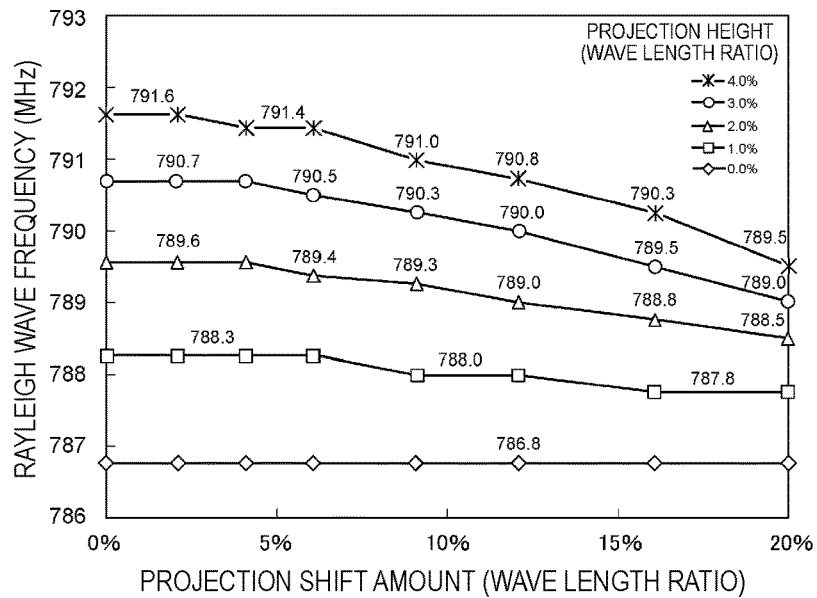
FIG. 10 is a graph showing a relationship between a resonant frequency of a Rayleigh wave response and an amount of shift of a projection which refers to a shift of an apex of the projection in an elastic wave propagation direction.

If the height H of the projection 6a on the surface of the dielectric film 6 varies, the position of the projection 6a varies, or other variations are present, there arises a risk that a variation in frequency occurs in the elastic wave device 1. FIG. 10 is a graph showing a relationship between a resonant frequency of a Rayleigh wave and a shift amount of an apex of the projection 6a in the elastic wave propagation direction.

The shift amount of the projection 6a is an amount indicated by "V" in FIG. 1B. In other words, in the case in which the apex of the projection 6a is shifted from a center line C, which passes through the center of the electrode finger, in the elastic wave propagation direction as indicated by a dot-dash line, an amount of shift of the apex corresponds to the shift amount of the projection 6a.

FIG. 10 shows results of cases in which the height H of the projection 6a is about 0% (a case of no projection), about 1.0%, about 2.0%, about 3.0%, and about 4.0% of the wavelength λ. In FIG. 10, for example, when the height H of the projection 6a is about 4.0% and the shift of the projection is about 0%, the resonant frequency of the Rayleigh wave is about 791.6 MHz. When the shift of the projection becomes about 20%, the resonant frequency is about 789.5 MHz. Accordingly, the magnitude of the frequency variation due to the shift of the projection 6a is about 2.1 MHz that is obtained by subtracting about 789.5 MHz from about 791.6 MHz. The about 2.1 MHz, when normalized by the Rayleigh wave frequency, corresponds to about 0.27%.

As is clearly understood from FIG. 10, as the shift amount of the projection 6a becomes larger, the frequency variation of the resonant frequency of the Rayleigh wave becomes larger. In addition, it is also understood that the frequency variation becomes larger as the height H of the projection 6a increases.

Figure 11:
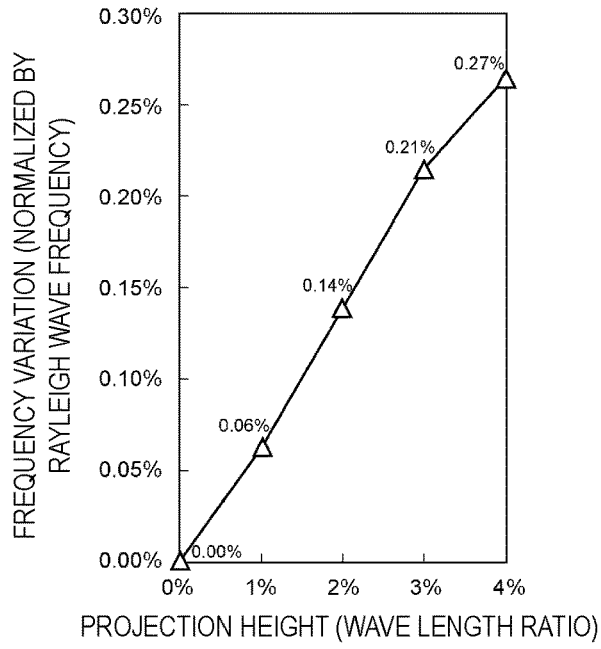
FIG. 11 is a graph showing a relationship between a height of a projection and a frequency variation of a resonant frequency of a Rayleigh wave.

FIG. 11 is a graph showing a relationship between a frequency variation and the height H of the projection 6a when the shift amount of the projection 6a is about 20% of the wavelength. As is clearly understood from FIG. 11, the frequency variation becomes large substantially in proportion to the height H of the projection 6a. When the height H of the projection 6a is about 4% of the wavelength λ, the frequency variation is about 0.27%. In other words, the frequency variation exceeding about 0.25% is generated.

As such, it is preferable for the height H of the projection 6a on the surface of the dielectric film 6 to be no more than about 3.0% of the wavelength λ, such that the frequency variation is able to be reduced.

Further, as discussed above, it is preferable for the height H of the projection 6a to be no less than about 0.5% of the wavelength λ, thus making it possible to distance the resonant frequency of the SH wave, which is an unnecessary wave, from the resonant frequency of the Rayleigh wave by no less than about 10 MHz. Accordingly, it is preferable for the height H of the projection 6a to be no less than about 0.5% and no more than about 3.0%, for example.

It is more preferable for the height H of the projection 6a on the surface of the dielectric film 6 to be less than about 1.0% of the wavelength λ, for example, because the frequency variation is able to be made less than about 0.06%.

Figure 12:
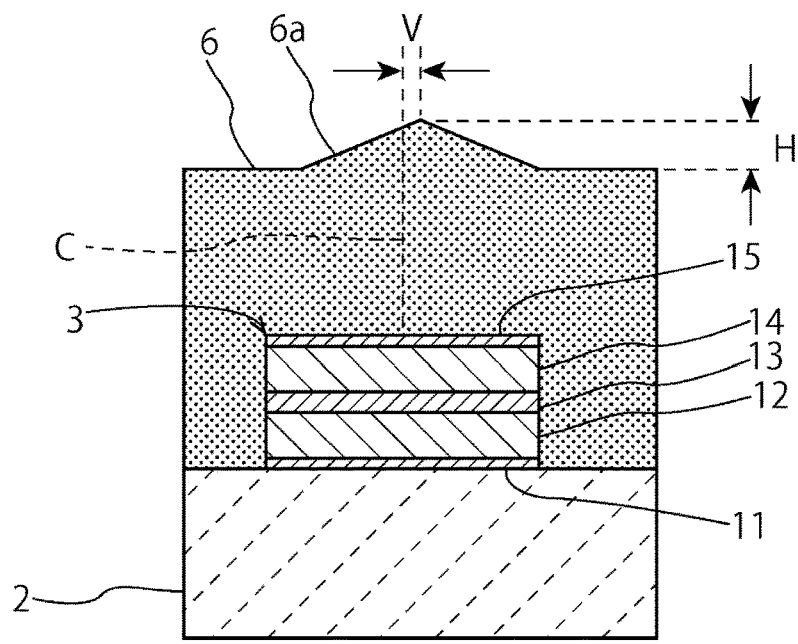
FIG. 12 is a partially enlarged front cross-sectional view illustrating a major portion of an elastic wave device according to a variation of a preferred embodiment of the present invention.

In the present preferred embodiment, the IDT electrode 3 is preferably a single-layered electrode made of only a main electrode, such as Pt, for example. However, in another preferred embodiment of the present invention, as illustrated in FIG. 12, the IDT electrode 3 may preferably be a laminated metal film including a plurality of metal films that are laminated. The IDT electrode 3 illustrated in FIG. 12 includes a close contact layer 11, a main electrode layer 12, a diffusion prevention layer 13, a low resistance layer 14, and a protection layer 15 in that order from bottom to top. The main electrode layer 12 is preferably made of a metal such as Pt, W, or the like mentioned above, for example. The close contact layer 11 is preferably made of a metal or an alloy, such as Ti or a NiCr alloy having higher adhesiveness with respect to $LiNbO_3$ than the main electrode layer 12, for example. The diffusion prevention layer 13 is preferably made of Ti or other suitable material, for example, and is provided to prevent the diffusion between the low resistance layer 14 and the main electrode layer 12.

The low resistance layer 14 is preferably made of a material, such as Al or an AlCu alloy, for example, having higher conductivity than the main electrode layer. The protection layer 15 is preferably made of an appropriate metal such as Ti, or an alloy, for example.

The laminated metal film may preferably define the IDT electrode. In such a case, the main electrode layer 12 plays a major role in obtaining the Rayleigh wave response. Therefore, it is preferable for the film thickness of the main electrode layer to fall within the film thickness range shown in Table 1 described above.

Although the one-port type elastic wave resonator is described in the preferred embodiments described above, the present invention may be applied, for example, to a band pass filter, such as a ladder filter to which a plurality of one-port type elastic wave resonators are connected, a multiplexer including the stated band pass filter, or other suitable device.

Figure 17:
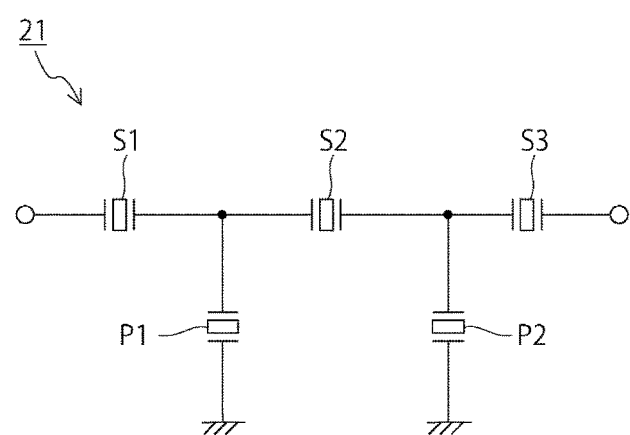
FIG. 17 is a circuit diagram illustrating a ladder filter according to a preferred embodiment of the present invention.

FIG. 17 is a circuit diagram illustrating a circuit configuration of a ladder filter as an example of such a band pass filter. A ladder filter 21 includes serial arm resonators S1 to S3 and parallel arm resonators P1 and P2. An elastic wave resonator according to a preferred embodiment of the present invention may be used as the serial arm resonators S1 to S3 and/or the parallel arm resonators P1 and P2.

Next, specific working examples 1 of preferred embodiments of the present invention will be described. In the following working examples 1, the elastic wave device 1 that is defined by an elastic wave resonator was prepared.

An LiNbO$_3$ substrate with Euler angles (0°, 30°, 0°) was used. As an IDT electrode, a laminated metal film in which NiCr, Pt, Ti, AlCu, and Ti were laminated in that order from the LiNBO$_3$ substrate side was used. The respective film thicknesses thereof were about 10 nm, about 250 nm, about 60 nm, about 340 nm, and about 10 nm. The film thickness of about 250 nm of the Pt film corresponds to about 6.25% in a wavelength ratio determined by the electrode finger pitch. The wavelength determined by the electrode finger pitch of the IDT electrode was about 4.0 µm, and the duty was about 0.65.

A SiO$_2$ film with a film thickness of about 1200 nm corresponding to about 30% in a wavelength ratio was provided as a dielectric film. The height H of the projection 6a was adjusted to be about 2% of the wavelength λ. The position of the projection was arranged at the center or approximate center of the electrode finger.

Figure 13:
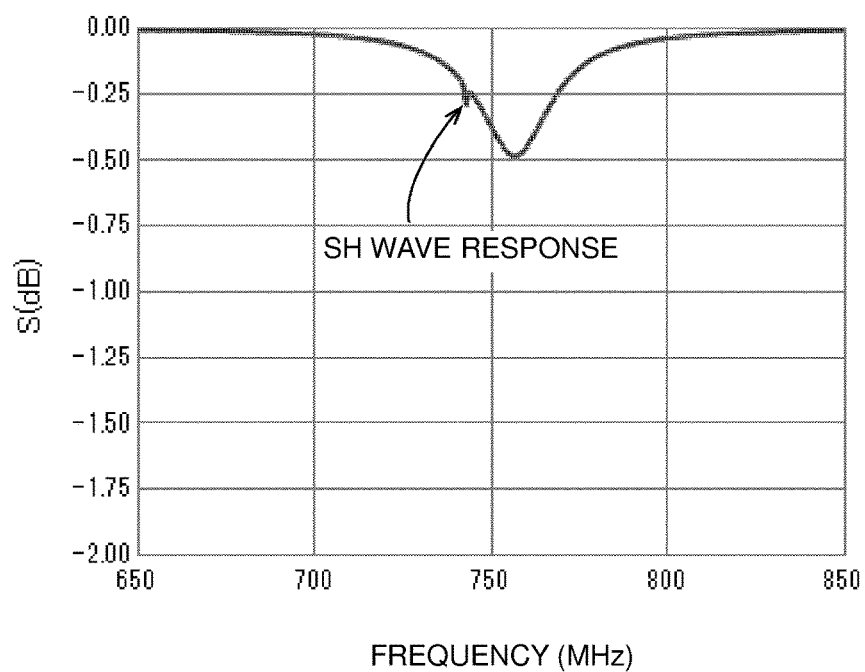
FIG. 13 is a graph showing frequency characteristics of an S (Scattering) parameter of an elastic wave resonator as a first working example of a preferred embodiment of the present invention.
Figure 14:
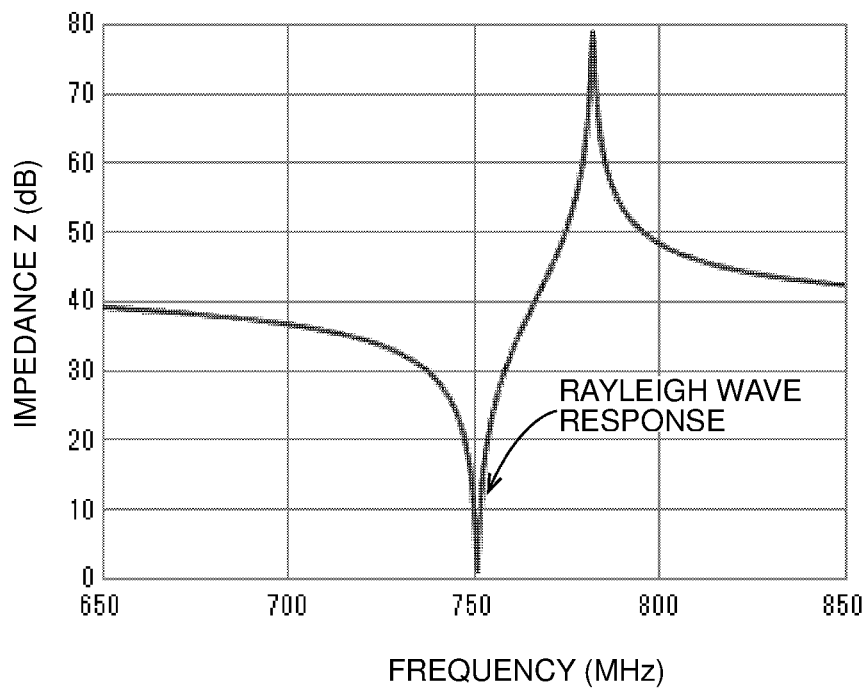
FIG. 14 is a graph showing impedance characteristics of the elastic wave resonator as the first working example of a preferred embodiment of the present invention.

FIG. 13 shows S characteristics of the elastic wave device of the first working example, and FIG. 14 shows impedance characteristics thereof. As is clear from FIGS. 13 and 14, a response by an SH wave appears at a position lower than a resonant frequency of a Rayleigh wave by about 13 MHz.

Figure 15:
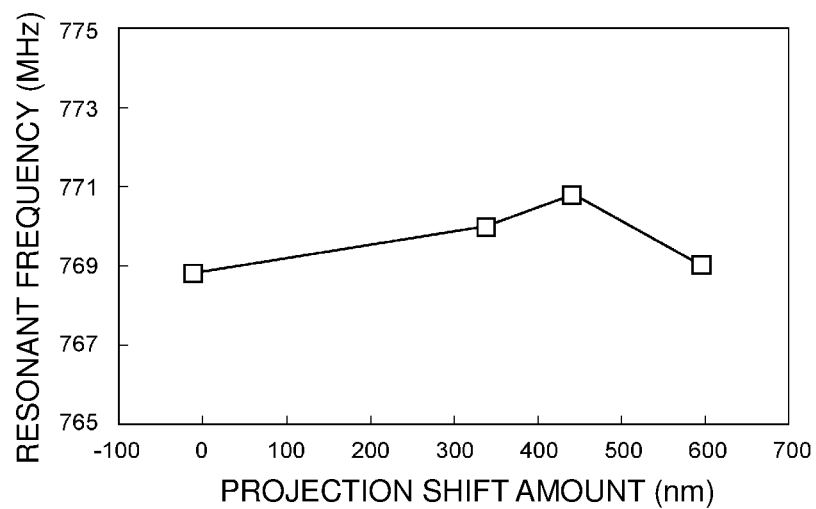
FIG. 15 is a graph showing a relationship between an amount of shift of a projection and a frequency of a Rayleigh wave response in the elastic wave resonator as the first working example of a preferred embodiment of the present invention.

FIG. 15 is a graph showing a change in resonant frequency when the shift amount of the projection is changed in the first working example. As is clearly understood from FIG. 15, even if the position of the projection is shifted by about 600 nm, the variation in resonant frequency of the Rayleigh wave is able to be kept to approximately 2 MHz or less.

Figure 16:
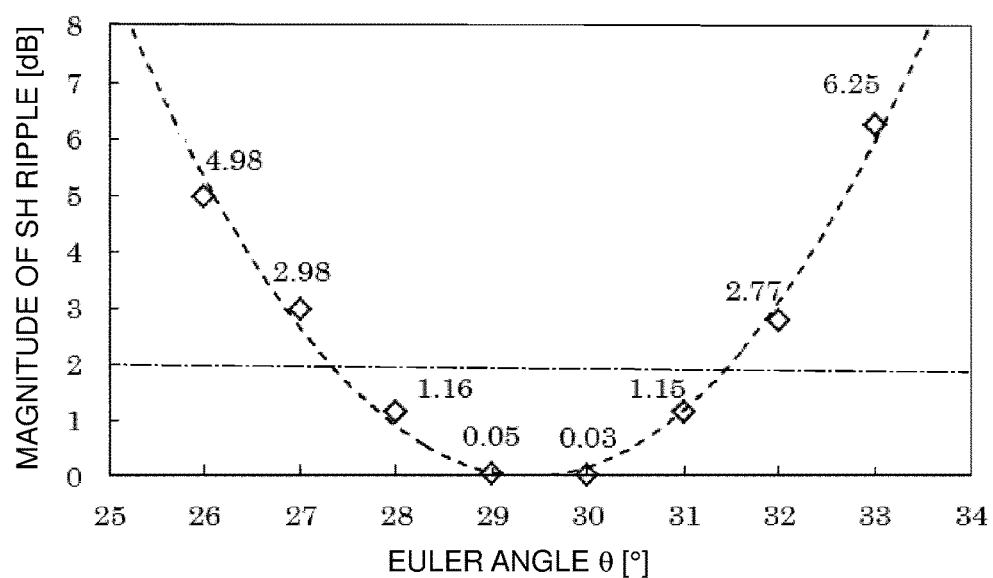
FIG. 16 is a graph showing a relationship between θ of Euler angles of $LiNbO_3$ and magnitude of a ripple by an SH wave.

FIG. 16 is a graph showing, using a broken line, a change in magnitude of the response by the SH wave in the case in which Euler angle θ is changed in the first working example. As is clear from FIG. 16, the magnitude of the SH wave response becomes smallest in the vicinity of Euler angle θ being about 29.5°. It is preferable for the magnitude of the SH wave response to be no more than about 2 dB, for example. In this case, it is preferable for Euler angles to be (0°, 27.5°-31.5°, 0°), for example. In addition, according to the experiments having been performed by the inventors of the preferred embodiments of the present invention, it has been confirmed that similar results were obtained if φ and ψ of Euler angles fell within a range of 0°±5°, for example. As such, for example, it is preferable for θ to fall within a range from no less than about 27.5° to no more than about 31.5°, while Euler angels being (in a range of about 0°±5°, θ, in a range of about 0°±5°).

The material of the IDT electrode is not limited to Pt, W, Mo, Ta, Au, or Cu cited above.

Any metal may be used if the electrode material and the thickness thereof are able to be set so that the response by the SH wave is positioned in a frequency region lower than the resonant frequency of the response of the Rayleigh wave.

Figure 19:
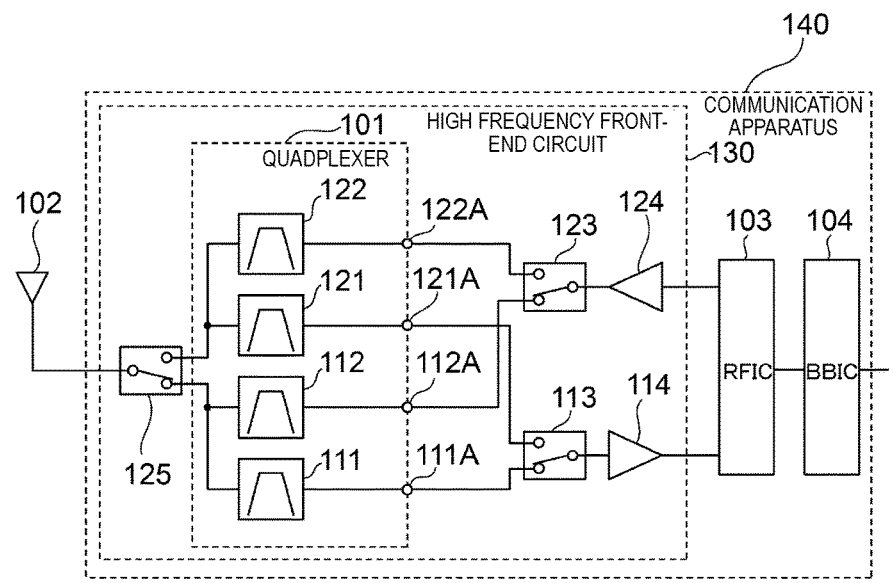
FIG. 19 is a configuration diagram of a high frequency front-end circuit.

FIG. 19 is a configuration diagram of a high frequency front-end circuit 130 according to a preferred embodiment of the present invention. In FIG. 19, elements (an antenna element 102, an RF signal processing circuit (RFIC) 103, and a baseband signal processing circuit (BBIC) 104) connected to the high frequency front-end circuit 130 are also illustrated. The high frequency front-end circuit 130, the RF signal processing circuit 103, and the baseband signal processing circuit 104 configure a communication apparatus 140. The communication apparatus 140 may preferably include a power supply, a CPU, a display, and other suitable components.

The high frequency front-end circuit 130 includes an antenna-side switch 125, a quadplexer 101, a reception-side switch 113, a transmission-side switch 123, a low noise amplification circuit 114, and a power amplification circuit 124. The elastic wave device 1 may preferably be the quadplexer 101, or one or more of the filters 111, 112, 121, and 122.

The reception-side switch 113 is a switching circuit including two selection terminals separately connected to a discrete terminal 111A and a discrete terminal 121A defining reception terminals of the quadplexer 101, and also including a shared terminal connected to the low noise amplification circuit 114.

The transmission-side switch 123 is a switching circuit including two selection terminals separately connected to a discrete terminal 112A and a discrete terminal 122A defining transmission terminals of the quadplexer 101, and also including a shared terminal connected to the power amplification circuit 124.

The reception-side switch 113 and the transmission-side switch 123 each connect the shared terminals to signal paths corresponding to predetermined bands in accordance with control signals from a control unit (not illustrated), and are each preferably, for example, an SPDT (Single Pole Double Throw) switch. The number of selection terminals connected to the shared terminal is not limited to one, and may be more than one. In other words, the high frequency front-end circuit 130 may support the carrier aggregation.

The low noise amplification circuit 114 is a reception amplification circuit that amplifies a high frequency signal (a high frequency reception signal in this case) that has passed through the antenna element 102, the quadplexer 101 and the reception-side switch 113, and outputs the amplified signal to the RF signal processing circuit 103.

The power amplification circuit 124 is a transmission amplification circuit that amplifies a high frequency signal (a high frequency transmission signal in this case) outputted from the RF signal processing circuit 103, and outputs the amplified signal to the antenna element 102 through the transmission-side switch 123 and the quadplexer 101.

The RF signal processing circuit 103 performs signal processing by down-conversion, for example, on the high frequency reception signal inputted thereto from the antenna element 102 through a reception signal path, and outputs the reception signal, which is generated by the signal processing, to the baseband signal processing circuit 104. Moreover, the RF signal processing circuit 103 performs signal processing by up-conversion, for example, on the transmission signal inputted thereto from the baseband signal processing circuit 104, and outputs the high frequency transmission signal, which is generated by the signal processing, to the power amplification circuit 124. The RF signal processing circuit 103 is preferably, for example, an RFIC. The signal having been processed by the baseband signal processing circuit 104 is used, for example, as an image signal for image display, or as a sound signal for conversation. Note that the high frequency front-end circuit 130 may include, between the above-discussed elements, another circuit element.

According to the high frequency front-end circuit 130 and the communication apparatus 140 discussed above, the inclusion of the quadplexer 101 makes it possible to reduce or prevent ripples within the pass band.

The high frequency front-end circuit 130 may include, in place of the above-described quadplexer 101, a quadplexer according to a variation on the quadplexer 101.

The elastic wave devices, the high frequency front-end circuits, and the communication apparatuses according to preferred embodiments of the present invention have been described. However, other preferred embodiments obtained by combining arbitrary elements of the above-mentioned preferred embodiments and variations thereof, variations obtained by performing various kinds of variations, conceived by those skilled in the art, on the above-described preferred embodiments within the scope that does not depart from the spirit of the present invention, various types of apparatuses in which the high frequency front-end circuit and the communication apparatus according to preferred embodiments of the present invention are built in, and the like are also included in the present invention.

For example, although it is stated in the above description that the elastic wave device may be a quadplexer or a filter, preferred embodiments of the present invention can be applied to, in addition to the quadplexer, multiplexers, such as a triplexer in which an antenna terminal is shared by three filters and a hexaplexer in which an antenna terminal is shared by six filters, for example. It is sufficient for the multiplexer to include two or more filters.

Further, the multiplexer is not limited to a configuration including both of a transmission filter and a reception filter. That is, the multiplexer may include only a transmission filter or only a reception filter.

Preferred embodiments of the present invention may be widely used, as a filter, a multiplexer that can be applied in a multi-band system, a front-end circuit, and a communication apparatus, in communication equipment such as a cellular phone and other suitable equipment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a LiNbO$_3$ substrate;
   an IDT electrode provided on the LiNbO$_3$ substrate; and
   a dielectric film that is provided on the LiNbO$_3$ substrate so as to cover the IDT electrode and includes a projection on an upper surface of the dielectric film; wherein
   a main mode of an elastic wave excited by the IDT electrode uses a Rayleigh wave;
   the IDT electrode includes a main electrode layer including at least one metal selected from a group consisting of Pt, W, Mo, Ta and Cu;
   a film thickness of the main electrode layer is set so as to fall within a film thickness range, as shown in Table 1, with respect to a wavelength λ determined by an electrode finger pitch of the IDT electrode;
   the projection of the dielectric film includes an apex; and
   the apex of the projection is shifted from a center line that passes through a center of a corresponding electrode finger of the IDT electrode in an elastic propagation direction of the IDT electrode;

TABLE 1

| | Film thickness (ratio with respect to λ) |
|---|---|
| Pt | 4.9% or more |
| W | 6.6% or more |
| Mo | 16.3% or more |
| Ta | 7.9% or more |
| Cu | 15.8% or more. |

2. The elastic wave device according to claim 1, wherein a height of the projection is, when a wavelength determined by an electrode finger pitch of the IDT electrode is taken as λ, no less than about 0.5% and no more than about 3.0% of λ.

3. The elastic wave device according to claim 2, wherein the height of the projection is no less than about 0.5% and less than about 1.0% of λ.

4. The elastic wave device according to claim 1, wherein, where Euler angles of the LiNbO$_3$ substrate are (0°±5°, θ, 0°±5°), θ falls within a range of no less than about 27.5° and no more than about 31.5°.

5. The elastic wave device according to claim 1, wherein the dielectric film is made of silicon oxide.

6. The elastic wave device according to claim 1, wherein the IDT electrode is made of a laminated metal film including the main electrode layer and at least one additional electrode layer.

7. The elastic wave device according to claim 1, wherein the elastic wave device is a band pass filter.

8. A high frequency front-end circuit comprising:
   the elastic wave device according to claim 1; and
   a power amplifier.

9. The high frequency front-end circuit according to claim 8, wherein a height of the projection is, when a wavelength determined by an electrode finger pitch of the IDT electrode is taken as λ, no less than about 0.5% and no more than about 3.0% of λ.

10. The high frequency front-end circuit according to claim 9, wherein the height of the projection is no less than about 0.5% and less than about 1.0% of λ.

11. The high frequency front-end circuit according to claim 8, wherein, where Euler angles of the LiNbO$_3$ substrate are (0°±5°, θ, 0°±5°), θ falls within a range of no less than about 27.5° and no more than about 31.5°.

12. The high frequency front-end circuit according to claim 8, wherein the dielectric film is made of silicon oxide.

13. The high frequency front-end circuit according to claim 8, wherein the IDT electrode is made of a laminated metal film including the main electrode layer and at least one additional electrode layer.

14. The high frequency front-end circuit according to claim 8, wherein the elastic wave device is a band pass filter.

15. A communication apparatus comprising:
   the high frequency front-end circuit according to claim 8;
   an RF signal processing circuit; and
   a baseband signal processing circuit.

16. The communication apparatus according to claim 15, wherein a height of the projection is, when a wavelength determined by an electrode finger pitch of the IDT electrode is taken as λ, no less than about 0.5% and no more than about 3.0% of λ.

17. The communication apparatus according to claim 16, wherein the height of the projection is no less than about 0.5% and less than about 1.0% of λ.

18. The communication apparatus according to claim 15, wherein, where Euler angles of the LiNbO$_3$ substrate are (0°±5°, θ, 0°±5°), θ falls within a range of no less than about 27.5° and no more than about 31.5°.

19. The communication apparatus according to claim 15, wherein the dielectric film is made of silicon oxide.

20. The communication apparatus according to claim 15, wherein the IDT electrode is made of a laminated metal film including the main electrode layer and at least one additional electrode layer.

* * * * *